United States Patent
Prasad et al.

(10) Patent No.: US 6,560,212 B1
(45) Date of Patent: May 6, 2003

(54) GENERATING AN OFFSET DE-BRUIJN SEQUENCE USING MASKS FOR A CDMA COMMUNICATION SYSTEM

(75) Inventors: Mohit K. Prasad, San Diego, CA (US); Xiao-An Wang, Allentown, PA (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 09/270,916

(22) Filed: Mar. 16, 1999

(51) Int. Cl.[7] ............................................... H04B 7/216
(52) U.S. Cl. ........................................ 370/335; 370/342
(58) Field of Search .............................. 370/342, 335; 375/140; 711/218, 219

(56) References Cited

U.S. PATENT DOCUMENTS

| | | | | |
|---|---|---|---|---|
| 5,878,075 A | * | 3/1999 | Frank et al. ................. | 375/130 |
| 6,005,888 A | * | 12/1999 | Barron ........................ | 375/140 |
| 6,141,374 A | * | 10/2000 | Burns ........................... | 331/78 |
| 6,246,676 B1 | * | 6/2001 | Chen et al. .................. | 370/342 |

* cited by examiner

*Primary Examiner*—Nguyen T. Vo
(74) *Attorney, Agent, or Firm*—Steve Mendelsohn; Ian M. Hughes

(57) ABSTRACT

An offset sequence generator generates an offset sequence from a reference sequence, the offset sequence being a cyclic-shifted version of the reference sequence. The reference sequence is a deBruijn sequence formed from a pseudo-noise (PN) sequence augmented with an insert-bit, the insert-bit being inserted at a rollover state of the PN sequence. The offset generator includes a decision circuit that selects values of either the reference sequence or a delayed reference sequence as an input to a mask circuit. The mask circuit applies masks so as to generate the PN sequence of the offset sequence. The decision circuit also detects the rollover state of the PN sequence of the offset sequence, and inserts the insert-bit so as to provide the offset sequence.

22 Claims, 4 Drawing Sheets

GENERATING AN OFFSET DE-BRUIJN SEQUENCE USING MASKS FOR A CDMA COMMUNICATION SYSTEM

BACKGROUND OF THE INVENTION

1. Field of the Invention

The present invention relates to telecommunication systems, and, more particularly, to generating offset sequences for a code-division, multiple-access (CDMA) based communication schemes.

2. Description of the Related Art

Several code-division, multiple-access (CDMA) standards have been proposed, and one such standard is the IS-95 standard adopted for cellular telephony. As with many CDMA systems, IS-95 employs both a pilot channel for a base station and data, or message, channels for communication between the base station and users. Each of the base station and users communicating with the base station employ one or more assigned, pseudo-random sequences, also known as pseudo-noise (PN) sequences, for spread-spectrum "spreading" of the channels. The PN sequences are used to spread, in frequency, data transmitted by the transceiver and to despread data received by the transceiver. The PN code sequence is used for both In-phase (I) and Quadrature-phase (Q) channels, is a sequence with a known number of bits, and is transmitted at a predetermined clock rate.

To determine when a signal is transmitted, and to synchronize reception and processing of a transmitted signal, the IS-95 standard specifies one or more correlation fingers, with each finger correlating a known portion of the PN code sequence with the sampled received signal. The pilot epoch is the time interval over which a PN sequence of a pilot signal repeats. The beginning of the PN sequence of the pilot channel occurs after the rollover state, which is the state at which the I-phase sequence and Q-phase sequence in respective PN generators have the same logic value in all register stages. The IS-95 system may insert an extra value in the PN sequence so that the length of the PN code sequence is an integer multiple of 2. The resulting augmented PN sequence is known in the art as a deBruijn sequence.

A (binary) PN sequence is a special form of linear shift register (LSR) sequence, so named since the sequences are generated with linear feedback of a shift register. Two popular LSR generators are Fibonacci and Galois code generators. Given a desired offset of K bits, the K-offset sequence may be generated with an LSR generator by either (i) re-initializing the state of the LSR or (ii) employing an appropriate linear combination of the state variables of the LSR. The offset K is an integer value, $1 \leq K \leq 2^r-1$, where r is defined as the order of the LSR PN sequence, and is generally the length of the shift register of the LSR.

The nth binary value $P_n$ of a PN sequence generated by an LSR generator may be defined by the following recursive formula of equation (1):

$$p_n = \sum_{i=1}^{r} g_i p_{n-i}, \tag{1}$$

where the $g_i$ are generating coefficients. Addition and multiplication of equation (1) are over the (binary) Galois field (GF(2)).

The generating function of the PN sequence P(D) is defined as given in equation (2):

$$P(D) = \sum_{n=0}^{\infty} p_n D^n. \tag{2}$$

where the value D is defined as a unit delay operator. Combining equation (1) and equation (2) provides equation (3):

$$P(D) = \frac{I(D)}{G(D)}, \tag{3}$$

where I(D) is the initial polynomial of the LSR sequence, the degree of which is at most r−1, and is defined as in equation (4):

$$I(D) = \sum_{i=0}^{r-1} \left( \sum_{j=i+1}^{r} g_j p_{i-j} \right) D^i \tag{4}$$

G(D) is referred to as the generating polynomial of the LSR sequence, and is defined as in equation (5):

$$G(D) = 1 + \sum_{i=1}^{r} g_i D^i \tag{5}$$

Equation (4) and equation (5) show that the generating function P(D) of an LSR sequence is completely specified by its initial polynomial I(D) and the generating polynomial G(D), the generating polynomial G(D) being represented by the generating coefficients $g_i$.

The PN sequence is periodic, with a period (number of sequence values) being the smallest integer N such that G(D) divides $(1+D^N)$ without a remainder. The zero-offset PN sequence having generating $P_0$ (D) may be defined as $p_0$, $p_1, \ldots, p_{N-1}, p_0, p_1, \ldots$, and $P_0$ (D)=$I_0$(D)|G(D), with $I_0$(D)=I(D) of equation (4).

The PN sequence offset by K bits may be a sequence as illustrated below:

$$\underbrace{\overbrace{p_{N-K}, p_{N-K+1}, \cdots}^{K}, p_{N-1}, p_0, p_1, \cdots, p_{N-K-1}, p_{N-K}, \cdots}_{N}$$

For a sequence offset by K bits, the "beginning" of the sequence is delayed by K bits values with respect to a reference sequence. The beginning, or zero-offset, of a periodic sequence may be arbitrarily defined within a PN sequence. For communication systems in accordance with an IS-95 standard, the reference (zero-offset) sequence is defined so that the short PN sequence starts a new cycle if the last 15 bits of the sequence from the LSR are 100000000000000 (the rollover state). For a particular implementation, additional logic may be required to insert the extra value into each sequence following 14 consecutive 1's or 0's. The extra value renders a $2^{15}$ chip period PN sequence. Consequently, for systems such as IS-95, at the beginning of the PN sequence the value in the first register stage is forced to a logic "0" prior to the next state transition.

The generating function $P_K(D)$ of the PN sequence offset by K may be defined as in equation (6):

$$P_K(D) = D^K P_0(D) + \sum_{i=0}^{K-1} p_{N-K+i} D^i = \frac{D^K I_0(D)}{G(D)} + \sum_{i=0}^{K-1} p_{N-K+i} D^i. \quad (6)$$

$P_K(D)$ may also be defined as in equation (7):

$$P_K(D) = \frac{I_K(D)}{G(D)}, \quad (7)$$

From equation (6) and equation (7), $I_K(D)$ may be defined as in equation (8):

$$I_K(D) = D^K I_0(D) \bmod G(D) \quad (8)$$

where mod (·) indicates the "modulo value of." Equation (8) shows the relation between the initial polynomials of the zero-offset and K-offset PN sequences. If $I_0(D)$ is the initial polynomial of an LSR sequence with an arbitrary offset, then $I_K(D)$ is the initial polynomial of the counterpart sequence with an offset of K bits. Therefore, the expression for $I_0(D)$ in equation (4) may given in equation (9):

$$I_0(D) = \sum_{i=0}^{r-1} \left( \sum_{j=i+1}^{r} g_j p_{n+i-j} \right) D^i \quad (9)$$

for some integer n.

A maximal length PN sequence with an offset of K bits from an original maximal length PN sequence is generated with a linear combination of the state variables of the LSR that relate $I_0(D)$ to $I_K(D)$. The process of employing a linear combination of the state variables is called masking. Masking is a form of 1-to-1 mapping from the LSR state at one instant to another LSR state at the same instant.

This mapping operation with masks (or masking operation) is shown in FIG. 1 for a maximal length PN sequence of 7 ($2^r-1$). Such PN sequence of FIG. 1 may be produced with an LSR of length 3 to yield the sequence length of 7. Each state $P_i$ has a corresponding set of values $p_{i-r}+1, \ldots, p_i$, corresponding to the stages of the LSR generator shift register. For convenience, the following defines the current value of the reference PN sequence as the currently generated value $p_i$. However, as would be apparent to one skilled in the art, some variations in the correspondence of the current value of the PN sequence and the value of the LSR stage may occur, depending upon whether the LSR generator is a Fibonacci or a Galois code generator. In addition, some variations may occur in the correspondence of the current value depending upon whether the sequence is provided from the last stage of the LSR or from the input to the first stage of the LSR.

As shown in FIG. 1, each masking operation $M_{ij}$ of a current state $P_i$ of the zero-offset PN sequence provides the corresponding offset value $p_j$ of the offset sequence. As is known in the art, the masking is of the state of the LSR. Consequently, the masking operation $M_{ij}$ not only employs the current value $p_i$, but also the previous values ($p_{i-1}, \ldots, p_{i-r}+1$) of the PN sequence corresponding to the current state of the LSR. As shown in FIG. 2, when an extra bit (or "insert-bit") is inserted into the original maximal length PN sequence, the mapping operation with masks may not be direct.

Referring to FIG. 3, there is shown a masking circuit 300 employed to generate an offset PN code sequence from a zero-offset sequence provided from a PN generator 308. As illustrated, PN generator 308 is a Fibonacci type LSR comprising shift register 302 having r stages, r being an integer greater than 0, r gain amplifiers 304, and a modulo-2 adder 310. The masking circuit 300 includes a mask register 312, which receives multibit mask value $M = m_{[r-1:0]}$ from a mask table (not shown), combiners 314 that may be AND operators or gates, and modulo-2 adder 316. Gain amplifiers 304 have values $g_r, \ldots, g_1$, which are polynomial coefficients g of the PN generating polynomial $G(D)$. Also, the multibit value of the stages in shift register 302 is $s_{[r:1]}$, and the mask value in mask register 312 is $M = m_{[n-1:0]}$. For the Fibonacci type LSR generator, the current state P of the LSR is $P_{[r-1:0]}$ Shift register 302 is initially loaded with a reference state $P_0$, which is the initial polynomial $I_0(D)$. Then, for each clock cycle, each bit of the multibit value $P_{[r:1]}$ of the shift register stages is multiplied by a corresponding one of the generating coefficients $g_r, \ldots, g_1$ via gain amplifiers 304. The output values of the gain amplifiers 304 are combined in modulo-2 adder 310 to provide new value $p_0$. This is a cyclic process. The value $P_0$ in modulo-2 adder 310 is then applied to the first element of the shift register 302 and the last element $P_r$ is discarded. Each value produced during the cyclic process becomes an element $P_n$ of the zero-offset PN sequence $PN_{[2^r-1:0]}$. The PN sequence may be provided as either the output of the last stage $p_r$ or the input $p_0$ of the first stage (from modulo-2 adder 310). For each state of the shift register 302, an element may be provided of the PN sequence shifted by an offset K. Combining a state of shift register 302 with a corresponding mask value stored in mask register 312 generates this element of the K-offset sequence. Each bit of the mask value $M = m_{[r-1:0]}$ is combined by combiners 314 with a corresponding one of the values $P_{[r-1:0:]}$ of shift register 302. The combined mask and register stage values are then modulo-2 added by adder 316 to provide the current element of the K-offset sequence.

Since the mask values loaded into the mask register, such as that shown in FIG. 3, are themselves a sequence of states, a variation in the masking operation from an insert-bit disrupts the sequence of masks. In addition, the application of masks by the mapping operation is disrupted since several consecutive values of the PN sequence on either side of the insert-bit are used during the masking operation.

SUMMARY OF THE INVENTION

The present invention relates to generating an offset sequence from a reference sequence. The reference sequence is a PN sequence with at least one insert-bit added to form, for example, a deBruijn sequence, and the offset sequence is a cyclic-shifted reference sequence. In accordance with an exemplary embodiment of the present invention, a value of either the reference sequence or a delayed reference sequence is selected based on either the presence of an insert-bit of the reference sequence or the presence of an insert-bit of the offset sequence. A multibit mask is applied to the selected value of step and at least one previous selected value to generate a value of the offset sequence. If necessary, the at least one insert-bit is inserted into the offset sequence. The sequence of operations is repeated to generate the entire cyclic-shifted reference sequence. Generating offset sequences in accordance with the present invention may allow the masking operation to apply the sequence of masks without an interruption. Consequently, the offset deBruijn sequences of, for example, an IS-95 receiver may be generated relatively easily and may be implemented with simple hardware logic.

BRIEF DESCRIPTION OF THE DRAWINGS

Other aspects, features, and advantages of the present invention will become more fully apparent from the following detailed description, the appended claims, and the accompanying drawings in which:

DETAILED DESCRIPTION

Figure 1:
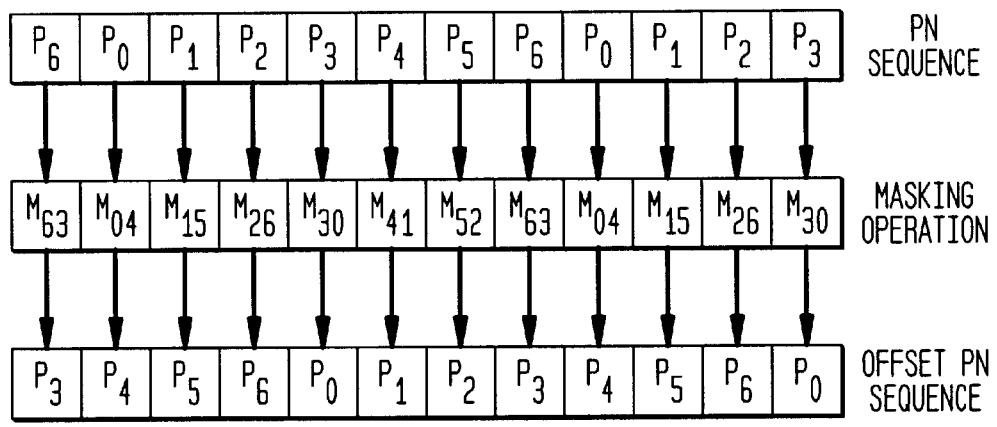
FIG. 1 shows a masking operation of a current value of a zero-offset PN sequence to provide the corresponding value of an offset PN sequence.
Figure 2:
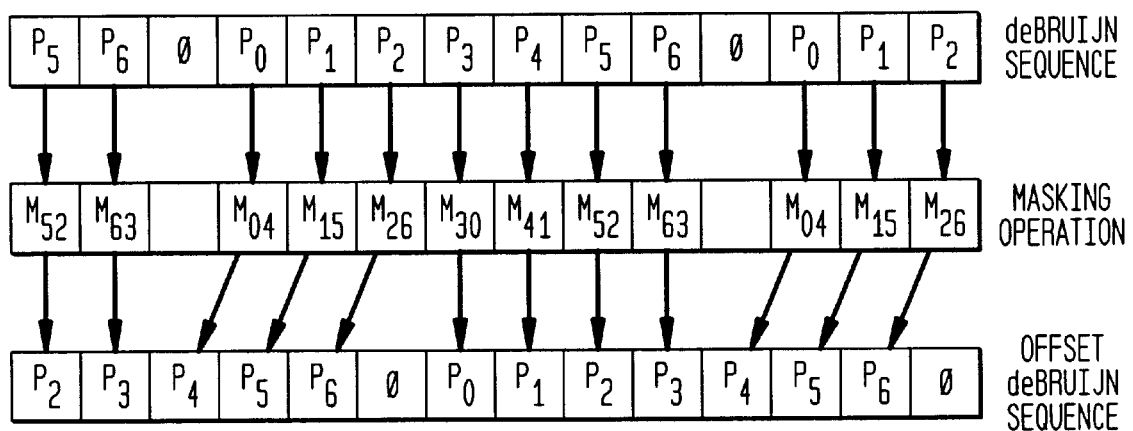
FIG. 2 shows a variation in a masking operation when an extra bit is inserted into an original maximal length PN sequence.
Figure 3:
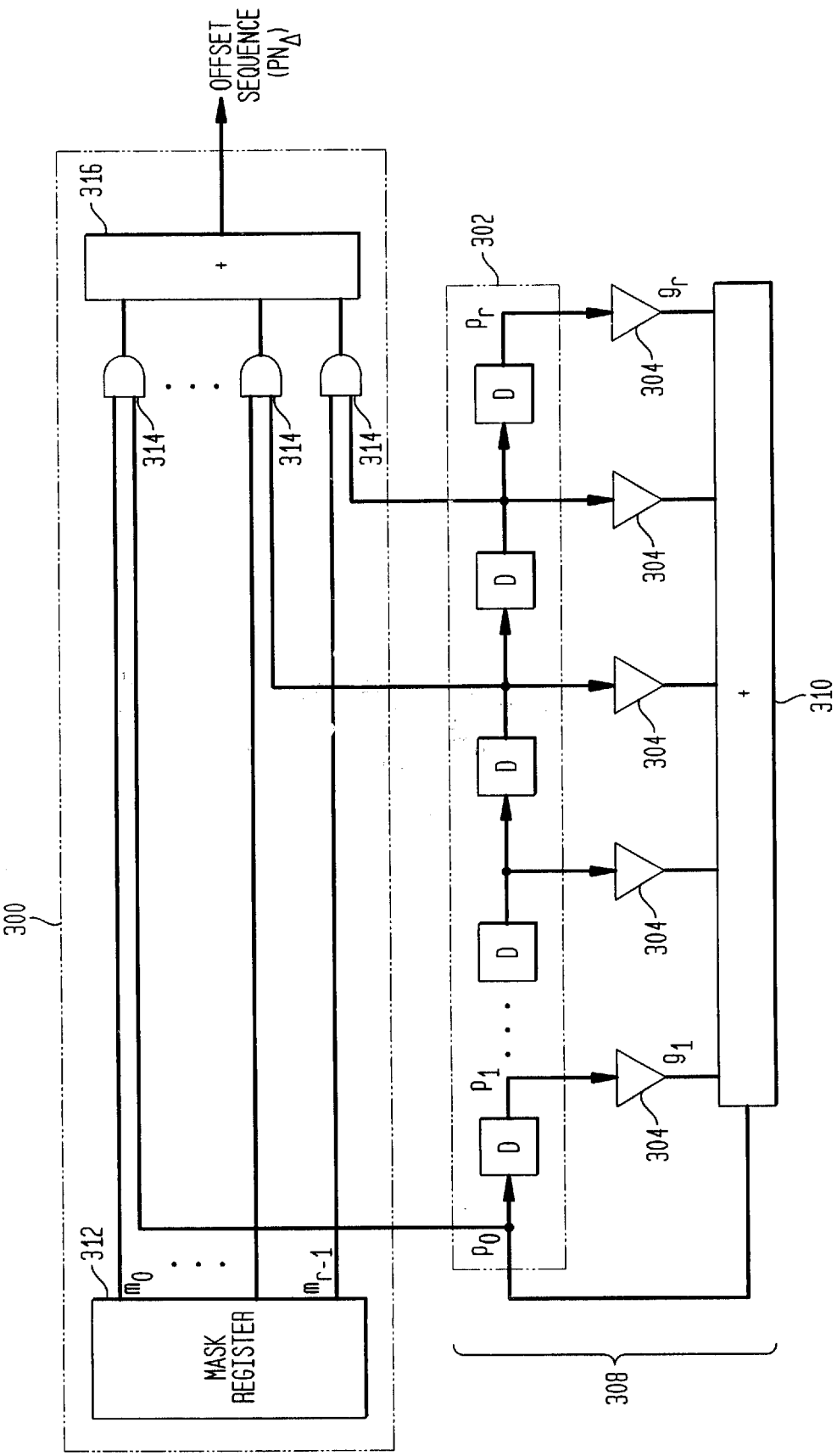
FIG. 3 shows a masking circuit of the prior art employed to generate an offset PN code sequence.
Figure 4:
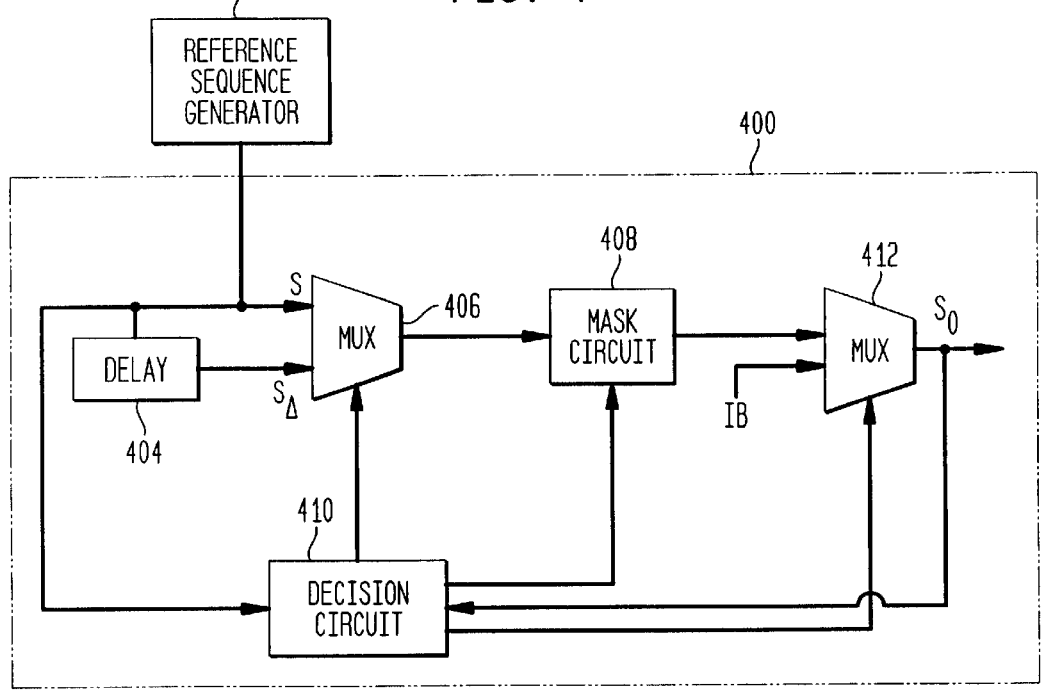
FIG. 4 shows an exemplary embodiment of an offset sequence generator in accordance with the present invention.

FIG. 4 shows an exemplary embodiment of an offset sequence generator 400 in accordance with the present invention. Offset sequence generator 400 comprises multiplexer (mux) 406, mask circuit 408, decision circuit 410, and mux 412. Offset sequence generator 400 may be provided a reference sequence S by a reference sequence generator 402 and a delayed version $S_A$ of the reference sequence by delay 404. The reference sequence S may be a zero-offset deBruijn sequence. The offset sequence generator 400 generates an offset sequence $S_O$ that is a cyclic-shifted version of the reference sequence S (e.g., a K-offset deBruijn sequence).

The reference sequence S may be formed by inserting at least one insert-bit into a PN sequence generated with a linear shift register (LSR) in accordance with a generating polynomial. The PN sequence may be generated with an LSR having r stages (registers) to provide an odd-length sequence of $2^r-1$. The rollover state of the LSR is defined as the last r values of the LSR before the PN sequence repeats (i.e., starts a new cycle). Since one property of PN sequences is that one state of the LSR is not generated (either the r-zeros state or the r-ones state), the rollover state may be defined as the state before this non-generated state (either the (r−1)-zeros state or the (r−1)-ones state). To provide a deBruijn sequence from the PN sequence, an extra zero or one is inserted as the insert-bit in the PN sequence after the rollover state (before the new cycle).

For example, the deBruijn sequence generated in accordance with the IS-95 standard starts a new cycle if the last 15 values of the sequence from the LSR are 100000000000000. The sequence from the LSR 100000000000000 corresponds to the state $P_{2^r-2}$ (there are $2^r-1$ states, but the index of P begins at 0, hence the last state is $P_{2^r-2}$). Since the all zeros state is not generated, the insert-bit is a zero inserted after the 14th consecutive zero. Although the following exemplary embodiments are described with deBruijn sequences as generated in, for example, a telecommunications transceiver operating in accordance with the IS-95 standard, the present invention is not so limited. Other types of augmented sequences may be employed.

The delay 404 delays the reference sequence S by a number of sequence values equivalent to the number of insert-bits inserted into the reference sequence S. For the described exemplary embodiment, the delay 404 delays the reference sequence S by a single sequence value to provides the delayed reference sequence $S_A$.

The mux 406 receives the reference sequence S and the delayed reference sequence $S_A$. The mux 406 provides, as an output sequence, values of either the reference sequence S or the delayed reference sequence $S_{66}$ based on a select signal from the decision circuit 410. The method by which the decision circuit 410 selects either the reference sequence S or the delayed reference sequence $S_A$ is described subsequently.

The mux 406 provides the output sequence of values to mask circuit 408. Mask circuit 408 applies a mask to the current value $p_i$ selected by the multiplexer and at least one previous value to generate the current value of the PN sequence of the offset sequence $S_O$ (i.e., the K-offset PN sequence of the K-offset deBruijn sequence). Since each LSR state is defined by a sequence of values in the registers of the LSR, the current value $p_i$ and r−1 previous values may define a current state $P_i$ of the LSR providing the PN sequence of the reference sequence S. The current state may be defined as being the initial polynomial $I_0(D)$.

The multibit mask applied by the mask circuit 408 relates the initial polynomial $I_0(D)$ to the polynomial $I_K(D)$ of the counterpart PN sequence with an offset of K bits (i.e., the initial polynomial of the LSR generating the K-offset PN sequence of the offset sequence $S_O$). The mask circuit 408 applies a multibit mask to the current state $P_i$ of the PN sequence to generate the current PN sequence value of the offset sequence $S_O$ (i.e., the output sequence value of the counterpart PN sequence with an offset of K generated by an LSR with the related initial polynomial).

The decision circuit 410 detects the presence of the rollover state of the PN sequence of the offset sequence $S_O$. The decision circuit 410 generates a select signal based on the presence of the rollover state. Mux 412 normally provides the output sequence of values generated by the mask circuit 408 as the offset sequence $S_O$. However, when the rollover state is detected, the mux 412 provides the value IB as the insert bit in response to the select signal from the decision circuit 410. The insert-bit IB may be, for the exemplary IS-95 embodiment, a zero.

The method by which the decision circuit 410 selects either the reference sequence S or the delayed reference sequence $S_A$ is now described. The decision circuit 410 generates the select signal to mux 406 based on the presence of an insert-bit of the reference sequence S. For the exemplary embodiment in accordance with the IS-95 standard, the decision circuit 410 generates the select signal to mux 406 to select the delayed reference sequence $S_A$ from when the insert-bit is detected in the reference sequence S until the insert-bit is inserted into the offset sequence $S_O$ by mux 412.

Figure 5:
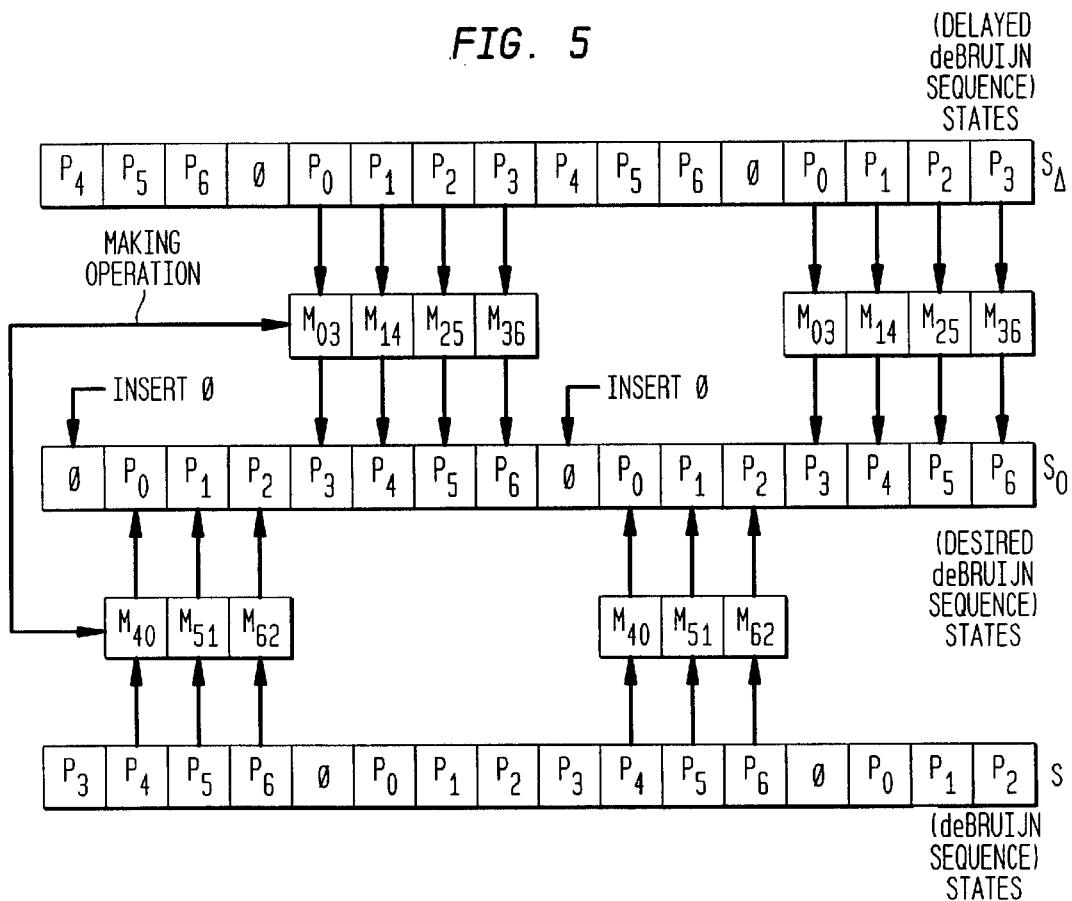
FIG. 5 shows detection of insert-bits by the decision circuit of FIG. 4 and relation to the offset sequence as shown in FIG. 4.

The detection of insert-bits by the decision circuit 410 and the relation to the offset sequence $S_O$ is illustrated with reference to FIG. 5. The reference sequence S comprises an exemplary PN sequence having states $P_0$ through $P_6$ (generated from an LSR having r=3 registers). The rollover state is defined as the state having the maximum number of consecutive zeros (i.e., at the second zero of the exemplary sequence 100, which is the rollover state $P_6$ where $p_4=1$, $p_5=0$, and $p_6=0$). Consequently, the (deBruijn) sequence S is generated by inserting a zero value as the insert-bit after the value $p_6$ generated at state $P_6$.

The decision circuit 410 tests the values of the reference sequence S for the maximum number of zeros to detect the rollover state $P_6$. If the maximum number of zeros is not detected, the select signal is generated for the mux 406 to provide the reference sequence S. For each value $p_i$ of the reference sequence S, the mask circuit 408 combines the current value $p_i$ and two previously received values $p_{i-1}$ and $p_{i-2}$ with multibit mask $M_{ij}$ to generate the new value $p_j$ of state $P_j$ of the offset sequence $S_O$ (i and j integers and $0 \leq i,j \leq 2^r-1$).

If the decision circuit 410 detects the maximum number of zeros of the rollover state $P_6$ of the reference sequence S, the select signal is generated for the mux 406 to provide the delayed reference sequence $S_A$. For each value of the delayed reference sequence $S_A$, the mask circuit 408 combines the current value $p_i$ of state $P_i$ and two previously received values $p_{i-1}$ and $p_{i-2}$ with multibit mask $M_{ij}$ to generate the new value $p_j$ (of state $P_j$) of the offset sequence $S_O$. As shown in FIG. 5, by switching between the reference and delayed reference sequences, the sequence of values transmitted to the mask circuit 408 is the PN sequence without an insert-bit. Consequently, the mask circuit may apply the sequence of multibit masks ($M_{40}$, $M_{51}$, $M_{62}$, $M_{03}$, $M_{14}$, $M_{25}$, and $M_{40}$) without an interruption. Such interruption may be the masking operation when an insert-bit is detected in the reference sequence when generating the PN sequence in the offset sequence. In the alternative, such interruption may be interrupting the generation of the PN sequence in the offset sequence.

The decision circuit 410 also detects the case of a maximum number of zeros of the rollover state $P_6$ of the K-offset PN sequence provided from the mask circuit 408. For this case, the decision circuit 410 provides a select signal to the mux 412 to provide the insert-bit IB to form the offset sequence $S_O$ from the K-offset PN sequence. Also for this case, the select signal provided to the mux 406 is in a "don't care" state: either the reference, delayed reference, or no sequence is provide by the mux 406. Mask circuit 408 may further employ a signal from the decision circuit 410 to disable the masking operation (disable the input and output ports) of mask circuit 408 when the insert-bit IB is inserted into the offset sequence $S_O$. After the insert-bit IB is inserted into the offset sequence $S_O$, the decision circuit 410 provides the select signal to mux 406 to select the reference sequence S as the output to the mask circuit 408.

Figure 6:
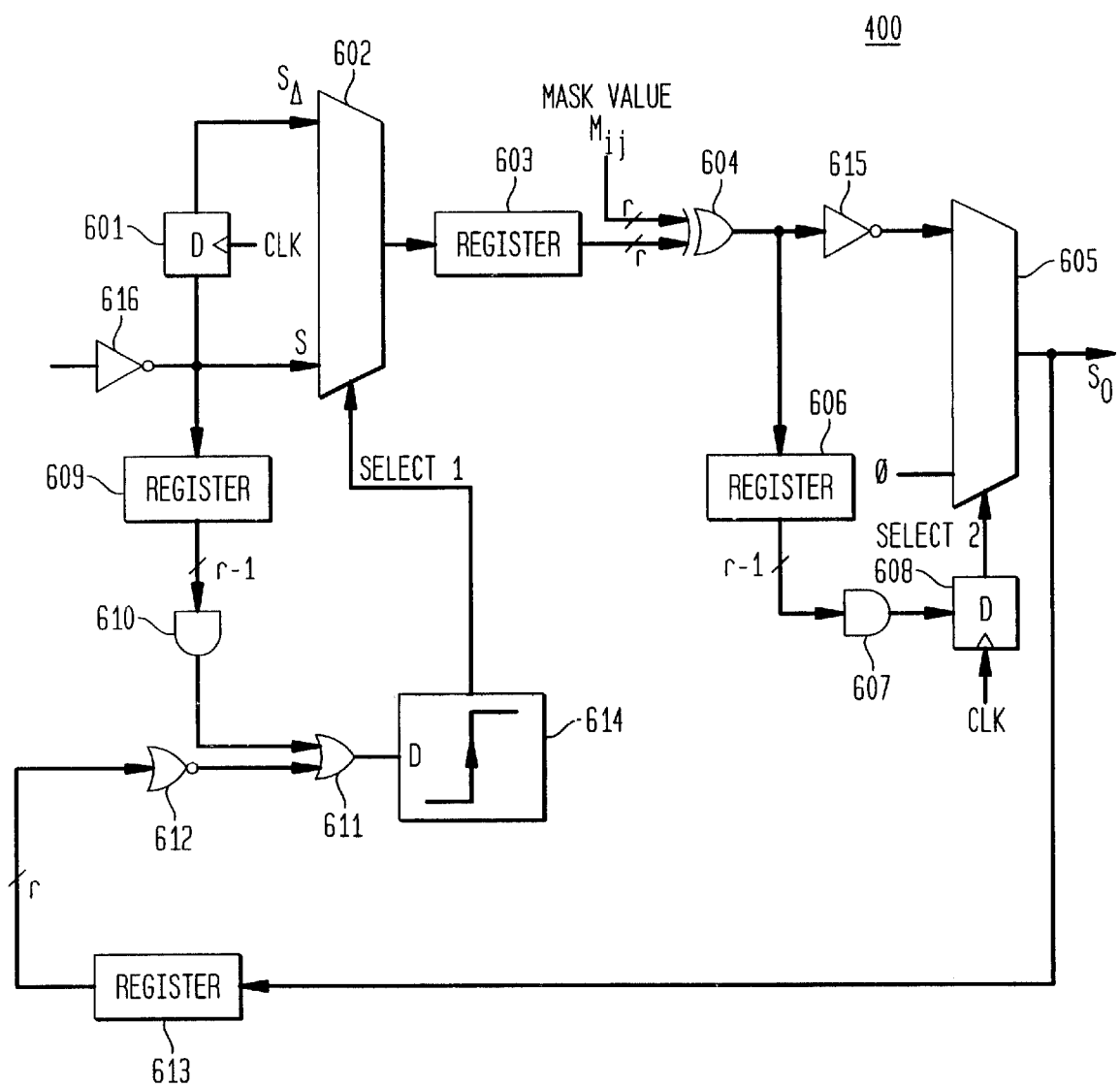
FIG. 6 shows an exemplary implementation of the offset sequence generator of FIG. 4 in accordance with the present invention.

FIG. 6 shows an exemplary hardware implementation of the offset generator 400 of FIG. 4 in accordance with the present invention. The exemplary hardware implementation may be preferred for an IS-95 receiver, and receives the reference sequence S from a separate reference sequence generator such as the reference sequence generator 402 of FIG. 4. Inverter 616 inverts the reference sequence S. Consequently, the r−1 consecutive zeros in reference sequence S appear as r−1 consecutive ones (here, r is an integer equal to the number of LSR stages).

The D flip-flop 601 provides the delayed reference sequence $S_A$ from the reference sequence S. When the signal select1 from T flip-flop 614 is one, the mux 602 provides the reference sequence S at its output port. When the signal select1 from the T flip-flop 614 is zero, the mux 602 provides the delayed reference sequence $S_A$ at its output port. Generation of the signal select1 is described subsequently.

Register 603 collects r sequence values provided serially from the mux 602, and provides a parallel word of length r to XOR operator 604. The parallel word of length r corresponds to a state of the LSR. XOR operator 604 also receives r-bit mask value $M_{ij}$ and combines the parallel word of length r with the r-bit mask value $M_{ij}$ in a logic exclusive-OR operation to provide the value $p_j$ of the K-offset PN sequence. The output sequence of XOR operator 604 is inverted with inverter 615 and provided to mux 605. If the signal select2 is zero, the output of the inverter 615 is provided as the current value of the (non-inverted) offset sequence $S_O$. If the signal select2 is one, the zero value corresponding to the insert-bit is provided as the current value of the (non-inverted) offset sequence $S_O$.

The signal select2 is generated as follows. The serial sequence values from XOR operator 604 are collected by register 606 into a parallel word of length r−1. The parallel word from register 606 is provided to AND operator 607. The output value of the AND operator 607 is latched by D flip-flop 608 and provided as the signal select2. Unless all values of register 606 are one, the output value of the AND operator 607 is a zero. When all values of register 606 are one (corresponding to the r−1 consecutive ones of the inverted PN sequence of the offset sequence), the output value of the AND operator 607 is a one. Latching the output value of the AND operator 607 with D flip-flop 608 provides a single sequence value delay. The delay allows the (r−1)th consecutive zero (inverted) from the inverter 615 to be transferred to the output port of mux 605 before the insert-bit is inserted.

The signal select1 is generated as follows. The serial values of reference sequence S are collected by register 609 into a parallel word of length r−1. The parallel word from register 609 is provided to AND operator 610. Unless all values of register 609 are one, the output value of the AND operator 610 is a zero. When all values of register 609 are one (corresponding to the r−1 consecutive ones of the inverted PN sequence), the output value of the AND operator 610 is a one.

The serial values of offset sequence $S_O$ are collected by register 613 into a parallel word of length r. The parallel word from register 613 is provided to NOR operator 612. The output value of the NOR operator 612 is provided to OR operator 611. Unless all values of register 613 are zero, the output value of the NOR operator 612 is a zero. When all values of register 613 are zero (corresponding to the r consecutive zeros of the offset sequence $S_O$), the output value of the NOR operator 612 is a one.

OR operator 611 receives the output values of the AND operator 610 and NOR operator 612, performs a logic-OR operation on these values, and provides the logic result to T flip-flop 614. As known in the art, the output value of the T flip-flop 614 changes when the current input value of the T flip-flop 614 changes state on a positive transition. Consequently, the signal select1 changes to a zero when the output of the AND operator 610 changes to a one, and signal select1 changes to a one when the output value of the NOR operator 612 changes to a one. Note that the corresponding output values of both NOR operator 612 and AND operator 610 are not concurrently one, since this implies that the offset sequence $S_O$ has a zero offset from the reference sequence S.

An offset sequence generator in accordance with the present invention may provide for the following advantages. The offset sequence generator allows the masking operation to apply the sequence of masks without an interruption in the masking operation when generating the PN sequence in the offset sequence. Consequently, the offset deBruijn sequences of an IS-95 receiver may be generated relatively easily. In addition, the decision circuit may be implemented with simple hardware logic. A complex processor (i.e., microprocessor) and related software routine may not be necessary. Consequently, the offset generator may be implemented within a small area of an integrated circuit, may require relatively low input power, and may be operated at relatively high clock rate.

As would be apparent to one skilled in the art, the various mask, PN, and reference sequences as described herein may be either be generated with circuits or by routines in software and the sequence values generated stored in a memory. Sequences may thus be generated with cyclic addressing of the values in memory. In addition, the rollover states may be defined differently depending on the PN generator employed (e.g., Galois or Fibonacci).

While the exemplary embodiments of the present invention have been described with respect to processes of circuits, the present invention is not so limited. As would be apparent to one skilled in the art, various functions of circuit elements may also be implemented in the digital domain as processing steps in a software program. Such software may be employed in, for example, a digital signal processor, micro-controller or general-purpose computer.

The present invention can be embodied in the form of methods and apparatuses for practicing those methods. The present invention can also be embodied in the form of program code embodied in tangible media, such as floppy diskettes, CD-ROMs, hard drives, or any other machine-readable storage medium, wherein, when the program code is loaded into and executed by a machine, such as a computer, the machine becomes an apparatus for practicing the invention. The present invention can also be embodied in the form of program code, for example, whether stored in a storage medium, loaded into and/or executed by a machine, or transmitted over some transmission medium, such as over electrical wiring or cabling, through fiber optics, or via electromagnetic radiation, wherein, when the program code is loaded into and executed by a machine, such as a computer, the machine becomes an apparatus for practicing the invention. When implemented on a general-purpose processor, the program code segments combine with the processor to provide a unique device that operates analogously to specific logic circuits.

It will be further understood that various changes in the details, materials, and arrangements of the parts which have been described and illustrated in order to explain the nature of this invention may be made by those skilled in the art without departing from the principle and scope of the invention as expressed in the following claims.

What is claimed is:

1. A circuit for generating an offset sequence from a reference sequence, the apparatus comprising:
    a multiplexer adapted to select a value of either the reference sequence or a delayed reference sequence based on a select signal, wherein the reference sequence is a pseudo-noise (PN) sequence having at least one incoming insert-bit and the offset sequence is a cyclic-shifted reference sequence;
    a mask circuit adapted to apply a multibit mask to the value selected by the multiplexer and at least one previous value selected by the multiplexer to generate a value of the offset sequence;
    a decision circuit adapted to insert, if necessary, one or more outgoing insert-bits into the offset sequence,
    wherein the decision circuit generates the select signal based on either the presence of the incoming insert-bit of the reference sequence or the presence of the outgoing insert-bit of the offset sequence.

2. The invention as recited in claim 1, wherein the decision circuit generates the select signal to select 1) the delayed reference sequence if the incoming insert-bit of the reference sequence is present, and 2) the reference sequence after the outgoing insert-bit is inserted into the offset sequence.

3. The invention as recited in claim 2, wherein the PN sequence is defined by a sequence of states, the sequence of states including a rollover state, and the decision circuit is further adapted to detect the presence of the rollover state in the offset sequence and insert the one or more outgoing insert-bits in the offset sequence after the rollover state.

4. The invention as recited in claim 1, wherein the PN sequence is defined by a sequence of states generated by a linear shift register (LSR) according to a generating polynomial, and the mask circuit applies the multibit mask to a current state of the PN sequence defined by the selected value and the at least one previous value, wherein the multibit mask relates the current state of the LSR to a current state of an LSR generating the PN sequence of the offset sequence.

5. The invention as recited in claim 1, wherein the PN sequence is defined by a sequence of states, the sequence of states including a rollover state, and the decision circuit is further adapted to detect the presence of the rollover state in the offset sequence and insert the one or more outgoing insert-bits after the rollover state of the offset sequence.

6. The invention as recited in claim 5, wherein the sequence of states is generated by a linear shift register (LSR) of r stages according to a generating polynomial, and the rollover state is either a (r−1)-ones state or a (r−1)-zeros state of the LSR.

7. The invention as recited in claim 1, wherein the reference and offset sequences are deBruijn sequences, and the offset sequence is generated in a telecommunications receiver operating in accordance with an IS-95 standard.

8. A method of generating an offset sequence from a reference sequence, the method comprising the steps of:
    a) selecting a value of either the reference sequence or a delayed reference sequence based on either the presence of an incoming insert-bit of the reference sequence or the presence of one or more outgoing insert-bits of the offset sequence, wherein the reference sequence is a PN sequence having at least one incoming insert-bit and the offset sequence is a cyclic-shifted reference sequence;
    b) applying a multibit mask to the selected value of step a) and at least one previous value selected in step a) to generate a value of the offset sequence; and
    c) inserting, if necessary, the one or more outgoing insert-bits into the offset sequence;
    d) repeating steps b) through c) to generate the offset sequence.

9. The method as recited in claim 8, wherein step a) includes the steps of:
    a1) selecting the delayed reference sequence if the incoming insert-bit of the reference sequence is detected; and
    a2) selecting the reference sequence after, in step c), the one or more outgoing insert-bits are inserted into the offset sequence.

10. The method as recited in claim 9, wherein the PN sequence is defined by a sequence of states, the sequence of states including a rollover state, and step c) further comprises the steps of:
    c1) detecting the presence of the rollover state in the offset sequence, and
    c2) inserting the one or more outgoing insert-bits after the rollover state.

11. The method as recited in claim 8, wherein the PN sequence is defined by a sequence of states generated by a linear shift register (LSR) according to a generating polynomial, and, for step b), the multibit mask is applied to a current state of the PN sequence defined by the selected value and the at least one previous value, the mask relating the current state to a current state of an LSR generating the PN sequence of the offset sequence.

12. The method as recited in claim 8, wherein the PN sequence is defined by a sequence of states, the sequence of states including a rollover state, and step c) further comprises the steps of:

c1) detecting the presence of the rollover state in the offset sequence, and c2) inserting the one or more insert-bits after the rollover state.

13. The method as recited in claim 12, wherein the sequence of states is generated by a linear shift register (LSR) having r stages according to a generating polynomial, and, for step c1), the rollover state is either a (r−1)-ones state or a (r−1)-zeros state of the LSR.

14. The method as recited in claim 8, wherein the reference and offset sequences are deBruijn sequences, and, for step d), the offset sequence is generated in a telecommunications receiver operating in accordance with an IS-95 standard.

15. An integrated circuit having circuit for generating an offset sequence from a reference sequence comprising.

a multiplexer adapted to select a value of either the reference sequence or a delayed reference sequence based on a select signal, wherein the reference sequence is a PN sequence with at least one incoming insert-bit added to the PN sequence and the offset sequence is a cyclic-shifted reference sequence;

a mask circuit adapted to apply a multibit mask to the value selected by the multiplexer and at least one previous value selected by the multiplexer to generate a value of the offset sequence; and a decision circuit adapted to insert, if necessary, one or more outgoing insert-bits into the offset sequence, wherein the decision circuit generates the select signal based on either the presence of an incoming insert-bit of the reference sequence or the presence of an outgoing insert-bit of the offset sequence.

16. The invention as recited in claim 15, wherein the decision circuit generates the select signal to select 1) the delayed reference sequence if the incoming insert-bit of the reference sequence is present, and 2) the reference sequence after the outgoing insert-bit is inserted into the offset sequence.

17. The invention as recited in claim 16, wherein the PN sequence is defined by a sequence of states, the sequence of states including a rollover state, and the decision circuit is further adapted to detect the presence of the rollover state in the offset sequence and insert the at least one outgoing insert-bit after the rollover state of the offset sequence.

18. The invention as recited in claim 15, wherein the reference and offset sequences are deBruijn sequences, and the offset sequence is generated in a telecommunications receiver operating in accordance with an IS-95 standard.

19. A computer-readable medium having stored thereon a plurality of instructions, the plurality of instructions including instructions which, when executed by a processor, cause the processor to implement a method for generating an offset sequence from a reference sequence, the method comprising the steps of:

a) selecting a value of either the reference sequence or a delayed reference sequence based on either the presence of an incoming insert-bit of the reference sequence or the presence of one or more outgoing insert-bits of the offset sequence, wherein the reference sequence is a PN sequence having at least one incoming insert-bit and the offset sequence is a cyclic-shifted reference sequence;

b) applying a multibit mask to the selected value of step a) and at least one previous value selected in step a) to generate a value of the offset sequence; and c) inserting, if necessary, the one or more outgoing insert-bits into the offset sequence;

d) repeating steps b) through c) to generate the offset sequence.

20. A receiver having an offset sequence generator for generating an offset sequence from a reference sequence, the offset sequence generator comprising:

a multiplexer adapted to select a value of either the reference sequence or a delayed reference sequence based on a select signal, wherein the reference sequence is a pseudo-noise (PN) sequence having at least one incoming insert-bit and the offset sequence is a cyclic-shifted reference sequence;

a mask circuit adapted to apply a multibit mask to the value selected by the multiplexer and at least one previous value selected by the multiplexer to generate a value of the offset sequence;

a decision circuit adapted to insert, if necessary, one or more outgoing insert-bits into the offset sequence, wherein the decision circuit generates the select signal based on either the presence of the incoming insert-bit of the reference sequence or the presence of the outgoing insert-bit of the offset sequence.

21. The invention as recited in claim 20, wherein the offset sequence generator of the receiver is included in a code-division, multiple-access (CDMA) telecommunications transceiver.

22. The invention as recited in claim 21, wherein the receiver operates in accordance with an IS-95 standard.

* * * * *